United States Patent [19]

Shay et al.

[11] Patent Number: 5,387,826
[45] Date of Patent: Feb. 7, 1995

[54] OVERVOLTAGE PROTECTION AGAINST CHARGE LEAKAGE IN AN OUTPUT DRIVER

[75] Inventors: Michael J. Shay, Arlington; Richard L. Duncan, Bedford, both of Tex.

[73] Assignee: National Semiconductor Corporation, Santa Clara, Calif.

[21] Appl. No.: 72,899

[22] Filed: Jun. 7, 1993

Related U.S. Application Data

[63] Continuation-in-part of Ser. No. 15,726, Feb. 10, 1993.
[51] Int. Cl.⁶ .............................................. H03K 17/10
[52] U.S. Cl. ........................................ 326/21; 361/91; 326/33; 326/83
[58] Field of Search ............... 307/443, 451, 473, 475, 307/550, 568; 361/91

[56] References Cited

U.S. PATENT DOCUMENTS

| | | |
|---|---|---|
| 3,949,242 | 4/1976 | Hirasawa et al. . |
| 4,583,203 | 4/1986 | Monk . |
| 4,583,204 | 4/1986 | Takemae et al. . |
| 4,670,668 | 6/1987 | Liu . |
| 4,670,861 | 6/1987 | Shu et al. . |
| 4,825,275 | 4/1989 | Tomassetti . |
| 4,862,240 | 8/1989 | Watanabe et al. . |
| 4,864,373 | 9/1989 | Miyashita . |
| 4,906,056 | 3/1990 | Taniguchi . |
| 4,930,112 | 5/1990 | Tanaka et al. . |
| 4,952,825 | 8/1990 | Yoshida . |
| 4,961,010 | 10/1990 | Davis . |
| 5,027,008 | 6/1991 | Runaldue . |
| 5,036,222 | 7/1991 | Davis . |
| 5,060,044 | 10/1991 | Tomassetti . |
| 5,087,579 | 2/1992 | Tomassetti . |
| 5,117,129 | 5/1992 | Hoffman et al. . |
| 5,134,316 | 7/1992 | Ta . |
| 5,160,855 | 11/1992 | Dobberpuhl . |
| 5,172,016 | 12/1992 | Dobberpuhl ..................... 307/451 X |
| 5,191,244 | 3/1993 | Runaldue et al. . |
| 5,266,849 | 11/1993 | Kitahara et al. ..................... 307/475 |

FOREIGN PATENT DOCUMENTS

| | | |
|---|---|---|
| 0305676A2 | 3/1989 | European Pat. Off. . |
| 0414354A1 | 2/1991 | European Pat. Off. . |
| 0480201A1 | 4/1992 | European Pat. Off. . |
| PCT/US91/-98341 | 11/1991 | WIPO . |

OTHER PUBLICATIONS

Paper entitled: "A Tidal Wave of 3-V ICs Open Up Many Options" by Dave Bursky, published in Electronic Design, Aug. 20, 1992, pp. 37–47.

Article entitled: "Level Transistor Logic with no DC Power Dissipation" published in the International Technology Disclosure Journal 9:06 by author unknown 104279.

*Primary Examiner*—David R. Hudspeth
*Attorney, Agent, or Firm*—Skjerven, Morrill, MacPherson, Franklin & Friel

[57] ABSTRACT

The present invention provides in some embodiments output buffers and input/output buffers which block the charge leakage from the bus to the internal power supply when the bus voltage exceeds in magnitude the internal power supply voltage or when the module is powered down. This functionality is achieved as follows in some embodiments. A PMOS isolation transistor is connected in series with a pull-up transistor between the internal power supply and the buffer output terminal connected to the bus. The gate of the isolation transistor is connected through a PMOS transistor P to the output terminal and through an NMOS transistor N to ground. The gates of transistors P and N are connected to each other. When the driver is enabled and the pull-up transistor is on, the gates of transistors P and N are high. Transistor P is therefore off. Transistor N is on grounding the gate of the isolation transistor. The isolation transistor turns on allowing the pull-up transistor to drive the output terminal. When the driver is disabled, the gates of transistors P and N are driven low. Transistor N is therefore off. When the voltage on the output terminal is above the absolute value |VTP| of the threshold voltage of transistor P, transistor P turns on connecting the output terminal to the gate of the isolation transistor. Thus, if the voltage on the output terminal exceeds in magnitude the internal power supply voltage, the isolation transistor is off because its gate and its drain are connected to the output terminal and are therefore at the same voltage. The backgate of the isolation transistor is connected to the transistor drain and hence the drain/backgate diode is off. The charge leakage is therefore suppressed.

6 Claims, 2 Drawing Sheets

OVERVOLTAGE PROTECTION AGAINST CHARGE LEAKAGE IN AN OUTPUT DRIVER

The present application is a continuation-in-part of the U.S. patent application Ser. No. 08/015,726 filed Feb. 10, 1993 by Michael J. Shay.

BACKGROUND OF THE INVENTION

1. Field of the Invention

The present invention relates to overvoltage protection, and more particularly to preventing charge leakage in output and input/output buffers when the voltage on the buffer output exceeds in magnitude the buffer internal power supply voltage or when the buffer is powered down.

2. Description of Related Art

Electronic systems sometimes combine modules powered by different supply voltages. For example, in battery powered laptop, notebook and hand-held computers, some modules are powered by a 3.0 V or 3.3 V voltage while other modules are powered by a 5.0 V voltage. The use of the lower power supply voltage such as 3.3 V reduces power consumption and thus allows extending the system operation time before the battery must be recharged or replaced. However, modules such as disk drives are powered by 5.0 V because they perform better when powered by the higher voltage.

If a 3.3 V module and a 5.0 V module are connected to a common bus and the bus is driven by the 5.0 V module with a 5.0 V signal, a charge leakage path may form between the bus and the 3.3 V power supply. For example, suppose that the output driver of an input/output buffer of the 3.3 V module includes a pull-up PMOS transistor connected between the 3.3 V voltage and the bus. When bus is driven by the 5.0 V module, the 3.3 V module drives the PMOS transistor gate with 3.3 V to turn the transistor off to tri-state the bus. When the bus voltage rises to 5.0 V, the PMOS transistor turns on providing a conductive channel between the bus and the 3.3 V power supply. Moreover, because the transistor backgate is typically held at 3.3 V, the drain/backgate diode turns on providing another conductive path between the bus and the 3.3 V power supply. The undesirable results include loading the bus and causing "bus contention", degrading the bus signals, and causing possible false signals on the bus.

Similar problems occur when a selected module is powered down while other modules are powered up, whether or not different power supply voltages are used in the system. When the module is powered down in order, for example, to save power or replace the module, a leakage path can form between the bus and the module internal power supply.

Thus, it is desirable to provide output drivers which do not provide a leakage path between the bus and the module internal power supply.

SUMMARY OF THE INVENTION

The present invention provides in some embodiments output buffers and input/output buffers which block the charge leakage from the bus to the internal power supply when the bus voltage exceeds in magnitude the internal power supply voltage or when the module is powered down. This functionality is achieved as follows in some embodiments. A PMOS isolation transistor is connected in series with a pull-up transistor between the internal power supply and the buffer output terminal connected to the bus. The gate of the isolation transistor is connected through a PMOS transistor P to the output terminal and through an NMOS transistor N to ground. The gates of transistors P and N are connected to each other. When the driver is enabled and the pull-up transistor is on, the gates of transistors P and N are high. Transistor P is therefore off. Transistor N is on grounding the gate of the isolation transistor. The isolation transistor turns on allowing the pull-up transistor to drive the output terminal.

When the driver is disabled, the gates of transistors P and N are low. Transistor N is therefore off. When the voltage on the output terminal is above the absolute value $|VTP|$ of the threshold voltage of transistor P, transistor P turns on connecting the output terminal to the gate of the isolation transistor. Thus, if the voltage on the output terminal exceeds in magnitude the internal power supply voltage which is greater than $|VTP|$, the isolation transistor is off because its gate and its drain are connected to the output terminal and are therefore at the same voltage.

The backgate of the isolation transistor is connected to the transistor drain and hence the drain/backgate diode is off. The charge leakage is therefore suppressed.

Other features and advantages of the invention are described below. The invention is defined by the appended claims.

DESCRIPTION OF THE PREFERRED EMBODIMENTS

Figure 1:
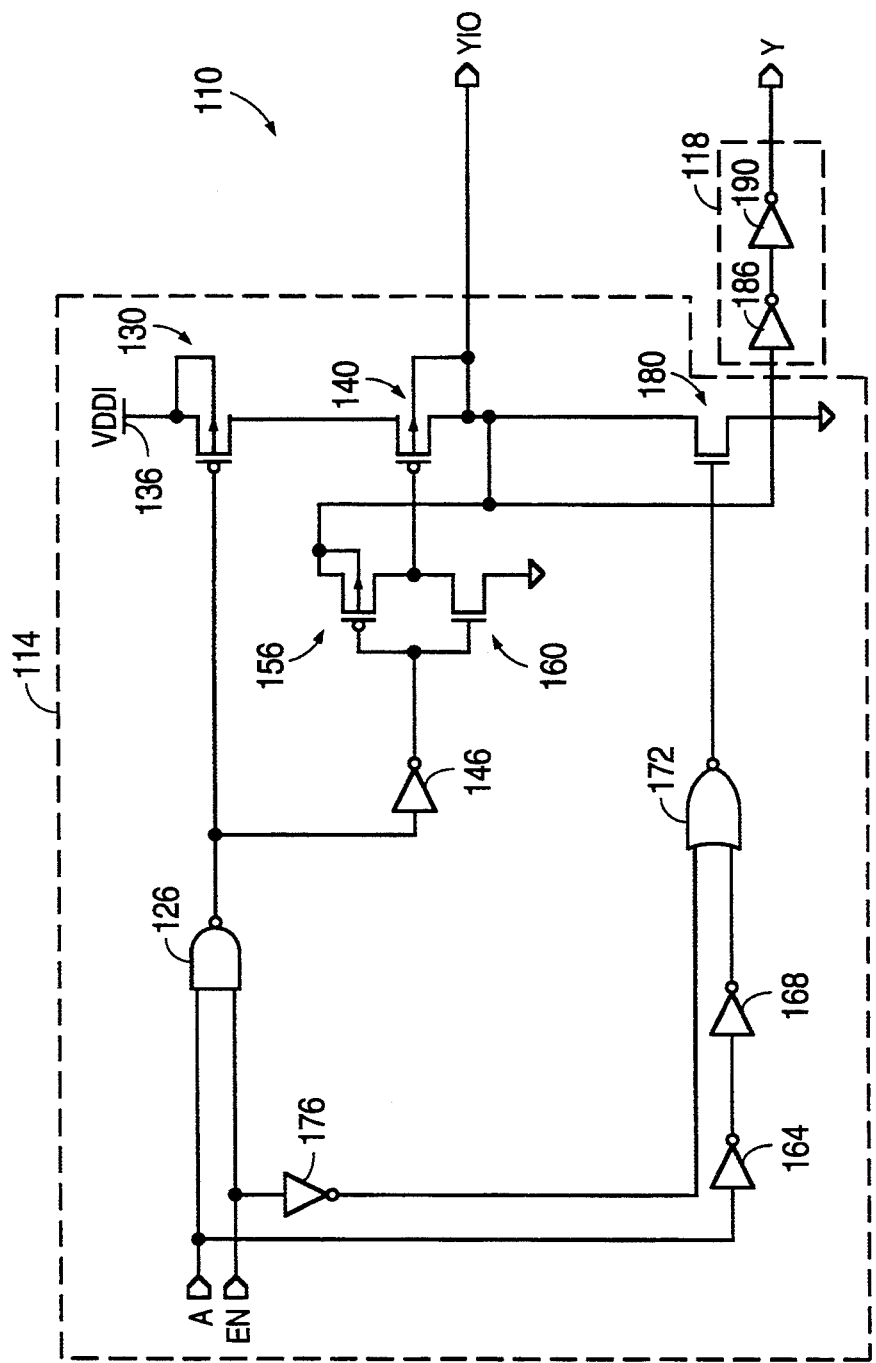
FIGS. 1 and 2 are circuit diagrams of input/output buffers according to the present invention.

FIG. 1 is a circuit diagram of input/output buffer 110. Buffer 110 includes output driver 114 and input buffer 118. Driver 114 receive signals on enable terminal EN and data input terminal A. When the enable terminal EN is at a high voltage, for example, 3.3 V, driver 114 drives input/output terminal YIO with a signal logically equivalent to the signal on data input terminal A. When enable terminal EN is at a low voltage, for example, ground, driver 114 tri-states input/output terminal YIO. Input buffer 118 amplifies input signals on terminal YIO and provides the amplified signals on terminal Y.

In some embodiments, input/output buffer 110 is powered by internal power supply voltage VDDI=3.3 V. Input/output terminal YIO is connected to a bus (not shown) connected also to one or more other modules (not shown) which can drive the bus with a higher voltage, for example, 5.0 V. As explained below, driver 114 includes overvoltage protection circuitry to prevent charge leakage from the bus to the buffer 110 power supply VDDI when the bus is at 5.0 V.

Driver 114 includes NAND gate 126 which has one input connected to data input terminal A and another input connected to enable terminal EN. In some embodiments, all the logic gates including gate 126 and all the inverters are implemented in CMOS technology.

The output of gate 126 is connected to the gate of PMOS pull-up transistor 130.

The source of transistor 130 is connected to power terminal 136 which receives the internal power supply voltage VDDI (VDD Internal). VDDI=3.3 V in some embodiments.

The backgate of transistor 130 is also connected to voltage VDDI.

The drain of transistor 130 is connected to the source of PMOS isolation transistor 140 whose drain and backgate are connected to input/output terminal YIO.

The output of NAND gate 126 is connected also to the input of inverter 146. The output of inverter 146 is connected to the gates of PMOS transistor 156 and NMOS transistor 160. The source and the backgate of transistor 156 are connected to input/output terminal YIO. The drain is connected to the drain of transistor 160 and to the gate of transistor 140. The source of transistor 160 is connected to a reference voltage such as ground.

Data input terminal A is connected through inverters 164 and 168 to one input of NOR gate 172. Enable terminal EN is connected through inverter 176 to another input of gate 172. The output of NOR gate 172 is connected to the gate of NMOS pull-down transistor 180. The drain of transistor 180 is connected to input/output terminal YIO. The source is connected to ground.

Input/output terminal YIO is connected to the input of inverter 186 of buffer 118. The output of inverter 186 is connected to the input of inverter 190. The output of inverter 190 is connected to terminal Y.

All the logic gates and inverters of buffer 110 are powered by voltage VDDI. The backgates of all the PMOS transistors except transistors 140 and 156 are connected to voltage VDDI. The gates of all the NMOS transistors are connected to ground.

In some embodiments the threshold voltage VTP of the PMOS transistors is about −0.9 V and the threshold voltage VTN of the NMOS transistors is about 0.7V.

When enable terminal EN is high, logic gates 126, provide on their respective outputs a signal logically inverse to the signal on data input terminal A. If terminal A is high, the gates of pull-up transistor 130 and pull-down transistor 180 are low. Transistor 130 is on, and transistor 180 is off. Inverter 146 drives the gates of transistors 156, 160 to 3.3 V. Transistor 156 is consequently off. Transistor 160 is on, grounding the gate of transistor 140. Transistor is therefore on. Transistors 130, 140 drive the terminal YIO with voltage VDDI.

When enable terminal EN is high and data input terminal A is low, pull-up transistor 130 is off and pull-down transistor 180 is on. Transistor 180 pulls down the voltage of terminal YIO.

When enable terminal EN is driven low to disable driver 114, the output of NAND gate 126 is high and the output of NOR gate 172 is low. Hence, transistors 130, 180 are off. The output of inverter 146 is low, that is 0 V. Transistor 160 is therefore off. If the voltage on input/output terminal YIO rises above the absolute value |VTP| of the threshold voltage of transistor 156, transistor 156 turns on providing a conductive path between terminal YIO and the gate of isolation transistor 140.

If another module drives the bus with a voltage higher than VDDI, for example, with 5.0 V, so as to turn on transistor 156, then the gate, the drain and the backgate of isolation transistor 140 are at the same voltage equal to the bus voltage. Because this voltage is higher than voltage VDDI, this voltage is higher than the voltage on the source of transistor 140. Thus the gate voltage of transistor 140 is at least as high as the source and drain voltages, and hence the field effect conduction in transistor 140 is suppressed. The drain/backgate diode of transistor 140 is off because the drain and the backgate are at the same voltage. Hence the diode conduction is also suppressed. Transistor 140 thus isolates the high voltage on terminal YIO from the power supply voltage VDDI, eliminating the charge leakage.

Because the backgate of transistor 156 is connected to the source of the transistor rather than to voltage VDDI, the source/backgate diode of transistor 156 does not provide a leakage path from the bus to voltage VDDI.

The charge leakage is similarly prevented when input/output buffer 110 is powered down, that is, VDDI is reduced to, for example, 0 V. Transistor 140 then prevents charge leakage when the bus voltage is above VDDI.

Figure 2:
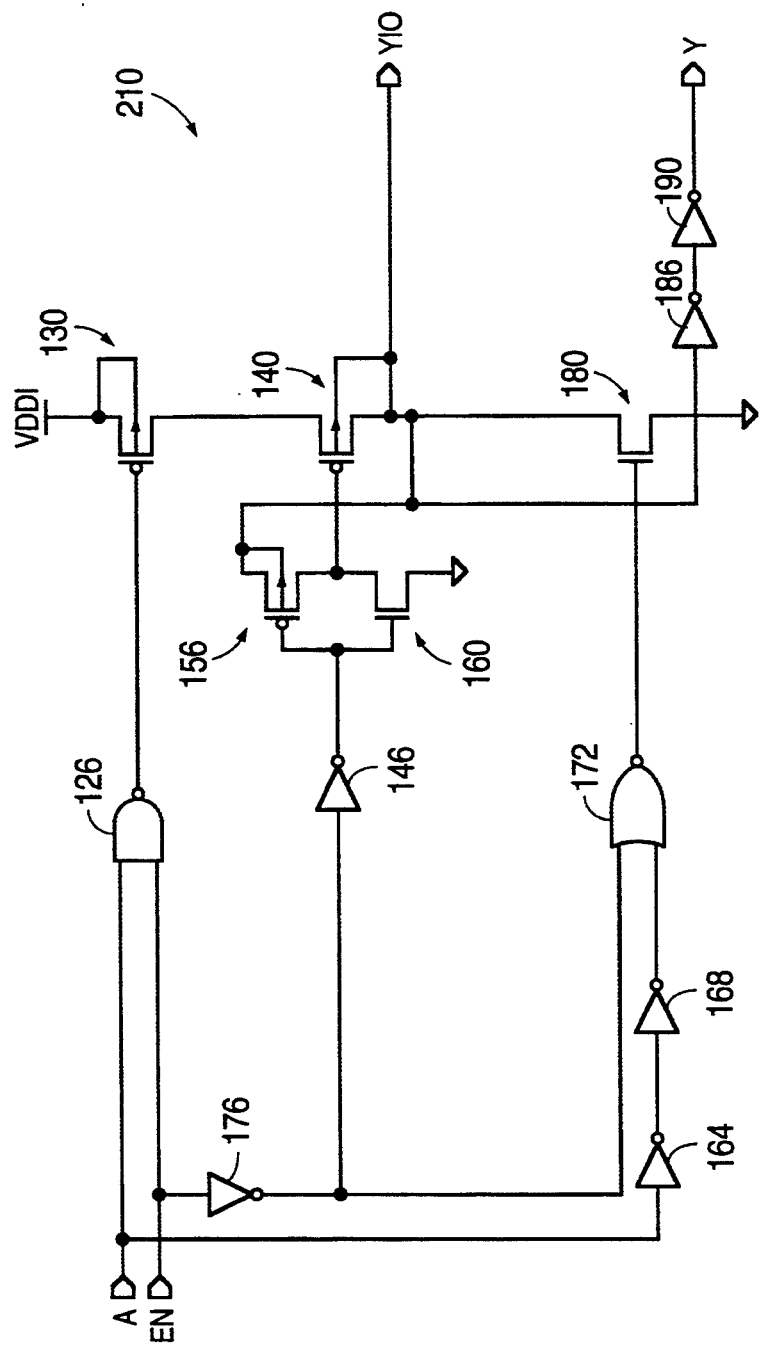

Input/output buffer 210 of FIG. 2 is similar to buffer 110 but the input of inverter 146 in FIG. 2 is connected to the output of inverter 176. When enable terminal EN is high, transistor 156 is off and transistor 160 is on. Transistor 140 is therefore on. When enable terminal EN is low, the output of inverter 146 is high. Transistor 140 prevents charge leakage as described above in connection with buffer 110.

While the invention has been illustrated with respect to the embodiments described above, other embodiments and variations are within the scope of the invention. In particular, the invention is not limited by the transistor sizes or threshold voltages. In some embodiments, transistors 130, 140 are interchanged so that the source of transistor 140 is connected to supply voltage VDDI, the drain is connected to the source of transistor 130, and the drain of transistor 130 is connected to input/output terminal YIO. The invention is suitable for output buffers, that is, in some embodiments input buffer 118 is omitted. The invention is not limited by particular voltage values. In some embodiments, VDDI is negative. A non-ground reference voltage is used in some embodiments. The invention is not limited by a particular fabrication technology. Thus, in some embodiments, the invention is implemented using NWELL CMOS technology in which circuits are formed on a P-doped substrate and the PMOS transistors are formed in one or more NWELLs. In other embodiments, PWELL technology or twin tub technology is used. In some embodiments, the entire input/output buffer is integrated, while in other embodiments discrete components are used. In some embodiments the bus is integrated with one or more modules, while in other embodiments the bus is not integrated. Other embodiments and variations are within the scope of the invention as defined by the following claims.

What is claimed is:

1. An output driver comprising:
   a power terminal;
   a circuit C1 having terminals T11 and T12 and having a control terminal CT1 for controlling a conductive path between said terminals T11 and T12, said terminal T11 being connected to said power terminal;
   a circuit C2 having terminals T21 and T22 and having a control terminal CT2 for controlling a conductive path between said terminals T21 and T22, said terminal T21 being connected to said terminal T12;
   an output terminal connected to said terminal T22;
   a circuit C3 having a terminal T31 connected to said output terminal and a terminal T32 connected to said control terminal CT2, said circuit C3 having a control terminal CT3 for controlling a conductive path between said terminals T31 and T32;

a circuit C4 having a terminal T41 connected to said terminal CT2 and having a terminal T42, said circuit C4 having a control terminal CT4 for controlling a conductive path between said terminals T41 and T42;

a reference voltage terminal connected to said terminal T42;

an enable terminal;

a data input terminal; and a circuit C5 for controlling said control terminals CT1, CT3 and CT4 in response to signals on said enable terminal and said data input terminal so that:

when said driver is enabled by a signal on said enable terminal and said circuit C5 causes said circuit C1 to provide a conductive path between said terminals T11 and T12, said circuit C5 also causes said circuit C3 not to provide the conductive path between said terminals T31 and T32 and said circuit C5 causes said circuit C4 to provide a conductive path between said terminals T41 and T42 so that said terminal CT2 becomes connected to said reference voltage terminal and causes said circuit C2 to provide the conductive path between said terminals T21 and T22; and when said driver is disabled by a signal on said enable terminal or when said driver is powered down, if a voltage on said output terminal exceeds in magnitude a voltage on said power terminal by at least a predetermined value, said circuit C5 causes said circuit C3 to provide a conductive path between said terminals T31 and T32 and said circuit C5 causes said circuit C4 not to provide the conductive path between said terminals T41 and T42 so that said circuit C2 does not provide the conductive path between said terminals T21 and T22.

2. The driver of Claim 1 wherein:

said circuit C2 comprises a transistor, said terminals T21, T22 being terminals of said transistor and said control terminal CT2 being a gate of said transistor; and when said driver is disabled or powered down and the voltage on said output terminal exceeds in magnitude the voltage on said power terminal by at least said predetermined value, said circuit C3 equalizes the voltages on said output terminal and the gate of said transistor.

3. The driver of Claim 2 wherein a backgate of said transistor is connected to said output terminal.

4. An output driver comprising:

a power terminal;

an output terminal;

transistors TR1 and TR2 connected in series between said power terminal and said output terminal;

transistor TR3 connected between said output terminal and a gate of said transistor TR2;

a reference voltage terminal;

transistor TR4 connected between said gate of transistor TR2 and said reference terminal;

a circuit controlling gates of said transistors TR1, TR3 and TR4 in response to an enable signal and a data input signal so that:

if said enable signal is asserted, said gate of transistor TR1 is controlled by said data input signal, and if transistor TR1 is on, then transistor TR3 is off and transistor TR4 is on causing transistor TR2 to be also on; and if said enable signal is deasserted or said driver is powered down, then said transistor TR4 is off, and if in addition a voltage on said output terminal exceeds in magnitude a voltage on said power terminal by at least a predetermined value, then said transistor TR3 is on.

5. The driver of Claim 4 wherein a backgate of said transistor TR2 is connected to said output terminal.

6. A method of preventing a charge leakage between an output terminal and a power terminal in an output driver, said method comprising the steps of:

when the driver is enabled and a data input signal indicates that said output terminal should be driven with a voltage on said power terminal, turning on a transistor TR1 and an isolation transistor TR2 that are connected in series between said power terminal and said output terminal, wherein isolation transistor TR2 is turned on by turning on transistor TR4 connected between a gate of transistor TR2 and a reference voltage; and when the driver is disabled, turning off said transistor TR4, and if a voltage on said output terminal exceeds in magnitude the voltage on said power terminal by at least a predetermined value, then turning on transistor TR3 connected between said output terminal and the gate of said transistor TR2 to turn off said transistor TR2.

* * * * *